United States Patent [19]

Naito et al.

[11] 4,395,776
[45] Jul. 26, 1983

[54] TRANSMITTER HAVING A PHASE SYNCHRONIZING SYSTEM

[75] Inventors: Yukio Naito, Tokyo; Masahide Tamura, Chigasaki; Shigeo Takahashi, Fujisawa, all of Japan

[73] Assignee: Toyo Communication Equipment Co., Ltd., Kanagawa, Japan

[21] Appl. No.: 269,029

[22] PCT Filed: Sep. 26, 1980

[86] PCT No.: PCT/JP80/00224
§ 371 Date: May 27, 1981
§ 102(e) Date: May 22, 1981

[87] PCT Pub. No.: WO81/00942
PCT Pub. Date: Apr. 2, 1981

[30] Foreign Application Priority Data

Sep. 27, 1979 [JP] Japan .................... 54-123196

[51] Int. Cl.³ .............................. H04B 1/04
[52] U.S. Cl. ............................ 455/119; 455/76; 455/113
[58] Field of Search ........ 455/42, 75, 76, 103, 455/110, 113, 119; 332/18, 19; 370/24

[56] References Cited

U.S. PATENT DOCUMENTS 3,644,831 2/1972 Latker et al. .............. 455/110
4,231,116 10/1980 Sekiguchi et al. .......... 455/119
4,259,744 3/1981 Junod et al. ............... 455/103

Primary Examiner—Jin F. Ng
Attorney, Agent, or Firm—Owen, Wickersham & Erickson

[57] ABSTRACT

A transmitter having a transmitting phase synchronizing system. To one input of a frequency mixer is applied the output of a phase synchronizing type digital frequency synthesizer, through a first frequency divider. A modulating signal is applied to another input of the frequency mixer. The output from the mixer is connected via a bandpass filter to a phase synchronizing system having in series, along a main route, a phase detector, a lowpass filter, and a voltage controlled oscillator, and thence to an amplifier system. In a feedback route from another outlet of the voltage controlled oscillator to the phase detector is a second fixed frequency divider. The digital frequency synthesizer itself may have a reference oscillator connected in series to a third fixed frequency divider, a second phase detector, a second lowpass filter and a second voltage controlled oscillator, from which a feedback circuit leads back to the phase detector via the first fixed frequency divider and a variable frequency divider.

9 Claims, 11 Drawing Figures

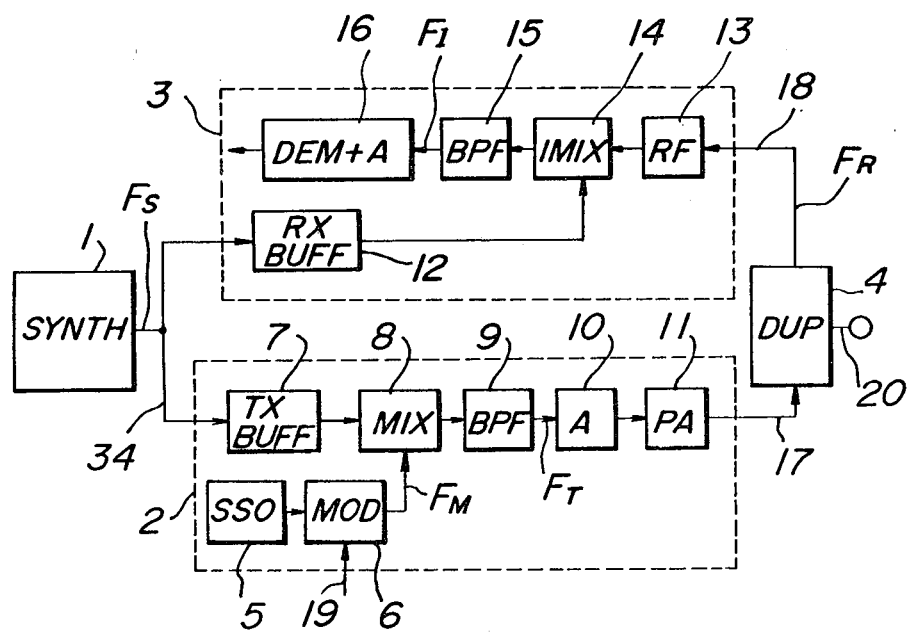
FIG_1 PRIOR ART
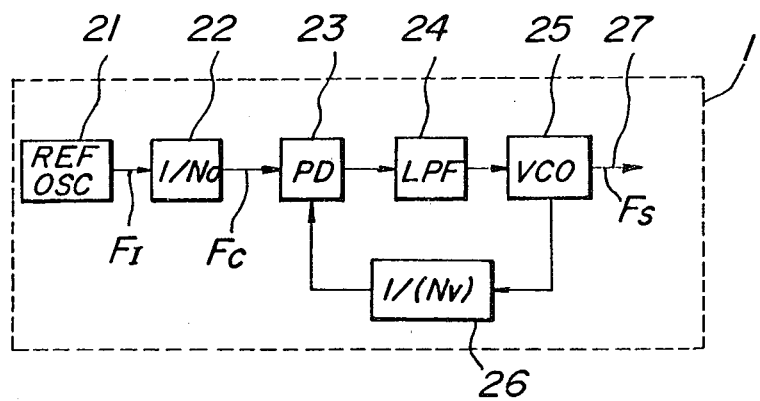
FIG_2 PRIOR ART

TRANSMITTER HAVING A PHASE SYNCHRONIZING SYSTEM

FIELD OF THE INVENTION

The present invention relates to a transmitter used in FM radio equipment for a multichannel simultaneous transmitting and receiving system, of the type used mainly in VHF and UHF bands.

BACKGROUND ART OF THE INVENTION

In a mobile communication system using VHF or UHF band frequencies, it is common for the frequencies to be multichannel and wide band. In this case, there is a strong requirement to decrease the transmission strength of spurious waves and to decrease noises in sideband, especially in the transmitting output signal in order not to disturb other communication systems.

On the other hand, due to the multichannel requirement of the communication system, the "phase synchronizing type digital frequency synthesizers" being easily obtainable, a very large number of frequencies are increasingly used as the signal source of the local oscillation frequency of the transmitter and the receiver. For such purpose, derives the local oscillation frequency signal source for the transmitter and for the receiver from a single phase synchronizing type frequency synthesizer widens the frequency bandwidth.

Such a device is basically constructed to have a phase synchronizing type of digital frequency synthesizer, a transmitter, a receiver, an antenna duplexer, and an antenna terminal. Further, in more detail, the transmitter comprises a side step oscillator, a phase or frequency modulator, a transmitting buffer amplifier, a frequency mixer, a bandpass filter, a preamplifier and a power amplifier. The receiver comprises, in more detail a receiving buffer amplifier, a receiving high frequency portion, an intermediate frequency converter, an intermediate frequency bandpass filter and a demodulator.

In this formation or arrangement of the transmitter, it is difficult to obtain a good signal having low noises and sufficiently suppressed spurious waves over a wide band at the transmitter output so that it has disadvantages of many technical and manufacturing problems.

SUMMARY OF THE INVENTION

The present invention is directed to solving the aforementioned problems. The main feature thereof may be summarized as follows: A phase synchronizing system having its reference frequency taken from an output signal of the bandpass filter is inserted between the bandpass filter and the preamplifier of the transmitter, and by this means the suppression or decrease of the aforementioned spurious waves and the sideband noises in the output of the transmitter is achieved.

According to the present invention, a high quality, wide band transmitter for FM radio equipment of the type having a multichannel simultaneous transmission and receiving system can easily be obtained in a miniaturized form and at low cost.

BRIEF DESCRIPTION OF THE DRAWINGS

FIG. 1 is a block diagram of conventional FM radio equipment for a multichannel simultaneous transmission and receiving system;

FIG. 2 is a block diagram of a digital frequency synthesizer of a phase synchronization type;

Figure 3:
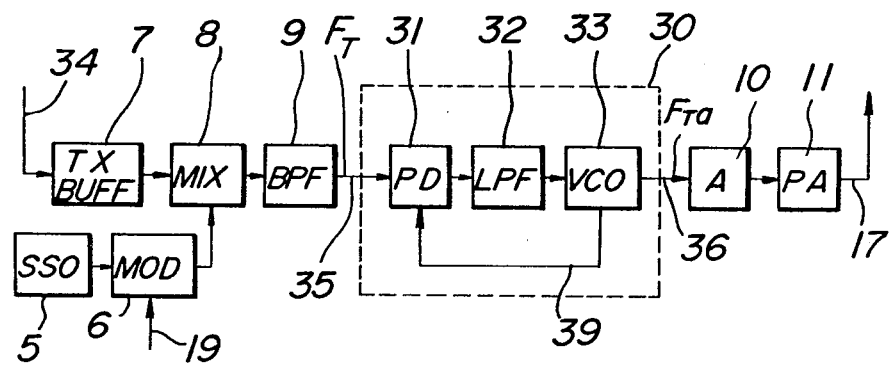
FIG. 3 is a block diagram of a transmitter according to the present invention.

Hereinafter, a transmitter using the transmitting phase synchronization system of the present invention will be explained by referring to the accompanying drawings.

A prior art device (FIGS. 1 and 2)

FIG. 1 is a block diagram of the aforementioned conventional FM radio equipment for a multichannel simultaneous transmitting and receiving system. The device comprises a phase synchronizing type digital frequency synthesizer 1, a transmitter 2, a receiver 3, an antenna duplexer 5, and an antenna terminal 20. The transmitter 2 comprises a side step oscillator 5, a modulator (a phase or frequency modulator) 6, a transmitting buffer amplifier 7, a frequency mixer 8, a bandpass filter 9, a preamplifier 10, and a power amplifier 11. The receiver 3 comprises a receiving buffer amplifier 12, a receiving high frequency portion 13, an intermediate frequency converter 14, an intermediate frequency bandpass filter 15 and a demodulator 16 as an ordinary form. The frequency relationship is given by the following formulae.

$$F_T = F_S + F_M \text{ or } F_T = F_S - F_M$$

$$F_R = F_S + F_I \text{ or } F_R = F_S - F_I$$

wherein;

$F_T$: output frequency of the output 17 of the transmitter $F_R$: input frequency of the receiver input 18

$F_S$: frequency of the output 34 of the frequency synthesizer 1 of the phase synchronization type $F_M$: output frequency of modulated wave of the modulator 6

$F_I$: center frequency of the intermediate frequency bandpass filter

The operation is explained as follows. The output 34 of the phase synchronizing type digital frequency synthesizer 1 is divided into two branches, one of which is used as a signal source of the local oscillator of the transmitter 2 and the other one of which is used as that of the receiver 3. The output 34 supplied to the transmitter 2 is fed to an input of a frequency mixer 8 via a transmitting buffer amplifier 7. A modulated wave output frequency $F_M$ is also fed to the input of the frequency mixer 8 from the modulator 6, which has its input from the side step oscillator 5 and a modulation input signal 19. A frequency converted component from the mixer 8 is supplied to a bandpass filter 9. Only a desired output signal $E_T$ therein is selectively filtered out and is further amplified in a preamplifier 10, and in a power amplifier 11 a desired output signal is obtained at the transmitter output 17. On the other hand the component 34 supplied to the receiver 13 is applied to an input of an intermediate frequency converter 14 via a receiving buffer amplifier 12. The receiver input signal $F_R$ is fed at 18 to an input of the intermediate frequency converter 14 via a high frequency portion 13, a frequency conversion is effected therein and among the converted output signals a desired output signal $F_I$ is selectively derived by an intermediate frequency bandpass filter 15 and a demodulated signal is obtained in a demodulator portion 16. (In the construction of a receiver, it is usual to design it as a double super heterodyne system by providing two, i.e. first and second, intermediate frequency bandpass filters, but this explanation is omitted since the detailed construction of the receiver is not concerned to the present invention.)

In this case, the problem is the aforementioned spurious waves and the noises in the sideband waves generated in or mixing into the transmission band of the output signal 17 of the transmitter 2.

We may consider at first the generation and mixing of the spurious waves. For realizing multichannel and wide band device a corresponding wide band is requested for a series of devices including the frequency mixer 8, the bandpass filter 9, the preamplifier 10, and the power amplifier 11, and among these, in the frequency mixer 8, an infinite number of combinations of frequencies expressed by the following conditional formula is derived at its output:

$$nF_S \pm mF_M$$

wherein; n and m are positive integers.

Now, if we assume that a frequency $(F_S+F_M)$ among the above is the desired frequency $F_T$, then all the other frequencies are regarded as the spurious waves which should be suppressed or filtered out by the bandpass filter 9 in the succeeding stages.

When the desired bandwidth becomes wider, the probability of numbers of spurious waves produced by the combination of the higher order numbers of m and n and falling in the bandwidth increases accordingly and causes a stronger spurious wave noises. In practice, suppressing the spurious waves produced inside the frequency mixer is in general done by adjusting either one of the inputs $F_S$ or $F_M$ at a considerably lower level than the others and using the frequency mixer 8 in a portion having good linearity characteristics in which the production of the spurious waves is comparatively low. However, if such "low level adjustment" is made, at the same time it is accompanied by a decrease of level difference between the signal level of the desired output wave of the frequency mixer 8 and the noise level already generated surrounding said output wave or mixing therewith, so that an increase of side wave noise by such noise level results.

Due to the above reasons, in a conventional transmitter 2 as shown in FIG. 1, the following technical practices had been considered for preventing generation of the spurious waves and for the suppression of the sideband wave noises: adjustment of the input level of the frequency mixer 8, making low passing loss of the bandpass filter 9, gain adjustment of the preamplifier 10 and the power amplifier 11, and selection of the modulated wave output frequency $F_M$ of the modulator 6 and that of output frequency $F_S$ of the phase synchronizing type digital frequency synthesizer 1 against the transmitting output frequency $F_T$.

However, it has been the situation at present that an effective improvement of the characteristics has not yet been realized since the aforementioned various adjustments and the selection of $F_S$, $F_M$ and the relationship of the attenuation characteristics of the bandpass filter are relatively correlated each other in a complicated manner, and they may mutually cause many difficulties so that the problems are unsolved.

Just for an example, details of the phase synchronizing type digital frequency synthesizer 1 are shown as one practical embodiment in a block form in FIG. 2. In this figure, there is a reference wave oscillator 21, a fixed frequency divider 22, a phase detector 23 in the main route, a lowpass filter 24, a voltage controlled oscillator 25, a variable frequency divider 26 on a feedback route, and an output 27.

In a block diagram formation as shown in FIG. 2, the frequency relation, in which 23, 24, 25, 26 are phase synchronized, is given by the following formula as is known already.

$$F_S = F_C \times N_V,$$

$$F_C = F_1/N_0$$

wherein;

$F_S$: frequency of the output 27
$F_1$: output frequency of the reference oscillator 21
$F_C$: output frequency of the fixed frequency divider 22
$N_0$: frequency dividing number of the fixed frequency divider 22
$N_V$: frequency dividing number of the variable frequency divider 26

Among the above, the three items, $F_1$, $F_C$, $N_0$ are fixed in general and $N_V$ may have a variation range corresponding to the channel number of the output frequency $F_S$, whereas if the frequency dividing number of the frequency divider 26 is varied as $N_V+1$, $N_V+2$, - - - $N_V+n$ under a condition that the closed loop is in phase synchronism, then the output frequency $F_S$ varies $F_S+F_C$, $F_S+2F_C$ - - - $F_S+nF_C$, respectively.

Description of some preferred embodiments of the invention

The device of FIG. 3

FIG. 3 shows a block diagram of an FM radio transmitter of a multichannel simultaneous transmitting and receiving system using a transmitting phase synchronizing system of the present invention. In this figure, blocks having the same reference numeral as in FIG. 1 have the same function as those shown in FIG. 1. (This will equally be applied in the other figures) In the figure, a portion 30 shown by encircled dotted line is the transmitting phase synchronizing system newly added to the conventional transmitter 2 shown in FIG. 1, and comprises a phase detector 31, a lowpass filter 32, a voltage controlled oscillator 33 on a main route and a fedback route 39.

The operation of the transmitting phase synchronizing system 30 will now be explained. The output frequency $F_T$ of the bandpass filter 9 and an output signal $F_{Ta}$ generated in the voltage controlled oscillator 33 are fed to the phase detector 31, and the signals are compared for their phases. The output signal of the phase detector 31 is applied to the lowpass filter 32 to remove spurious wave components and then to a control input terminal of the voltage controlled oscillator 33. This series of loop circuit is a negative fedback phase control system, and if the output frequency $F_T$ of the bandpass filter 9 coincides with the output frequency $F_{Ta}$ of the voltage controlled oscillator 33 (or if both frequencies are the same; $F_T = F_{Ta}$), the output signal of the phase detector 31 becomes a dc component and this will control the phase of the oscillation frequency $F_{Ta}$ of the voltage controlled oscillator 33.

If the input signal 34 coming from the phase synchronizing type digital frequency synthesizer 1 is shifted from $F_S$ to $(F_S + F_C)$ in a manner as has been described in the foregoing, the output frequency of the bandpass filter 9 changes to $(F_T + F_C)$ thereby. At the same time, the transmitting phase synchronizing system 30 follows therewith, and a signal having $(F_{Ta} + F_C)$ can be obtained in the output 36. Further if the input signal is switched to $(F_S + nF_C)$, a signal of $(F_{Ta} + nF_C)$ instead of $F_{Ta}$ can likewise be obtained in the output 36. As is known already, this transmitting phase synchronizing system 30 exhibits variable type band characteristics, having its bandpass characteristics of a certain bandwidth corresponding to the frequency response characteristics of this closed loop, and the center frequency thereof varies in accordance with the input signal $F_T$ at phase synchronizing condition from the input 35 to the output 36. Accordingly, if the bandwidth of this transmitting phase synchronizing system 30 is made as narrow as possible in an extent of variation range of the input signal $E_T$, and in a range in which the phase synchronization is sufficiently possible and also is made not to give an influence to the demodulated wave characteristics, the aforementioned spurious waves and the sideband noises may sufficiently be suppressed.

Now we may explain one embodiment for a possible method for narrowing the band of the passband while securing the phase synchronizing range of the transmitting phase synchronizing system 30 as follows.

Now, if we assume that the transmitting phase synchronizing system 30 is synchronized with the output frequency $F_T$ of the bandpass filter 9, at the switching of $F_T$ to $F_T + nF_C$, instantaneously the frequencies go out of synchronization, and a beat signal of frequency $nF_C$ is produced at the output of the phase detector 31. If the cutoff frequency of the frequency response characteristics of the loop 30 is equal to $nF_C$ or is higher than that, the output frequency $F_{Ta}$ of the voltage controlled oscillator 33 is directly controlled by this beat signal to become $(F_{Ta} + nF_C)$, and again is phase synchronized. Accordingly, for realizing the narrow bandwidth, at the same time of lowering the cutoff frequency of the loop 30, the oscillating frequency of the voltage controlled oscillator 33 is switched in, ganged with the variation of the frequency dividing number $N_V$ of the variable frequency divider 26 of the phase synchronizing type digital frequency synthesizer 1 shown in FIG. 2, and the frequency of the beat signal produced in the output of the phase detector 31 may be lowered lower than the loop cutoff frequency thereby. By this the intended narrow bandwidth of the transmitting phase synchronizing system 30 can be realized.

By the block formation of the transmitter according to the present invention and as shown in FIG. 3, in which the transmitting phase synchronizing system 30 is inserted, the drawback of the conventional transmitter, in that the spurious waves generated in the frequency mixer 8 falls in the transmitting band, may easily be improved. This means at the same time to construct the bandpass filter 9 in a very simple circuit arrangement.

In accordance with the present invention, it is possible to keep the oscillation output level of the voltage controlled oscillator 33 sufficiently higher than the noise level produced or mixed therearound. Therefore, it becomes possible to substantially decrease the amplification gain of the preamplifier 10 and that of the power amplifier, 11 so that a transmitter output 17 of improved sideband noise characteristics can be obtained by a simple construction.

The present invention may at first glance may appear to be just a very simple improvement, such as, the insertion of the block 30, but the effects obtained thereby are unexpectedly large.

By some alternation of the blocks and addition of the same to the construction of the invention as will be explained hereinafter, still more effects can be obtained.

Figure 4:
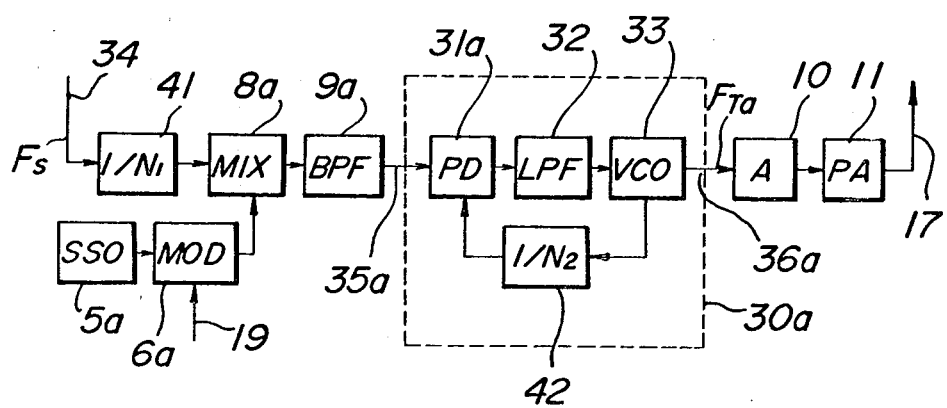
FIG. 4 is a block diagram for an improved embodiment of the transmitter shown in FIG. 3.

The device of FIG. 4

FIG. 4 provides a further improvement of the aforementioned transmitting system, wherein a fixed frequency divider 41 having the number of frequency division $N_1$ is inserted in place of the transmitting buffer amplifier 7 in the block construction shown in FIG. 3 between the input 34 and a frequency mixer 8a. And at the same time in the feedback route of a transmitting phase synchronizing system 30a, a fixed frequency divider 42 having the number of frequency division $N_2$ is added, and by this the bandpass filtering characteristics between the input 35a and the output 36a at the phase synchronization can be made still narrower in the bandwidth without narrowing the phase synchronizing range of the transmitting phase synchronizing system 30a, and without switching the frequency of the voltage controlled oscillator 33 in a manner ganged with the switching of the frequency dividing number $N_V$ of the variable frequency divider 33 as mentioned above.

The operation of the transmitting system of FIG. 4 will be explained, at a case where $N_1 = N_2 = N$. The input signal $F_S$ at the input 34 is frequency divided by N times in the fixed frequency divider 41, and the obtained output $F_S/N$ is applied to the input of the frequency mixer 8a. If we assume that the frequency mixer 8a and a bandpass filter 9a have 1/N bandwidth characteristics of the transmitting frequency bandwidth handling 1/N frequency with the frequency used in FIG. 3, further that a side step oscillator 5a and a modulator 6a are to handle 1/N frequency of that shown in FIG. 3, the frequency mixer 8a mixes a modulated wave output signal $F_M/N$ of the modulator 6a having its carrier wave of the oscillating frequency of the side step oscillator 5a with said $F_S/N_1$ and after selectively filtering out of a signal of $F_S/N + F_M/N = F_T/N$ in the bandpass filter 9a, it is applied to the input of a phase detector 31a. On the other hand a part of the output signal of the voltage controlled oscillator 33 has its frequency divided by N in the fixed frequency divider 42 in the feedback route and the output signal of $F_{Ta}/N$ is also applied to the input of the phase detector 31a. In the phase detector 31a, the phases of the signals are compared and if $F_T/N = F_{Ta}/N$ is established, the loop system is now phase synchronized. Now, when we assume that the transmitting phase synchronizing system 30a is in the phase synchronizing condition, and when the input frequency $F_T/N$ of the input 35a is switched to $(F_T+nF_C)/N$ due to switching of the channel of the phase synchronizing type digital frequency synthesizer 1, a beat signal of $nF_C/N$ appears at the same instance at the output of the phase detector 31a, but by simply securing the loop frequency response characteristics to said range of $nF_C/N$, a narrow bandwidth of the transmission frequency bandwidth of the block 30a viewed from the input 35a to the output 36a can very easily be realized.

When adding a frequency divider in the feedback route of the phase synchronizing system, it is known already that the frequency at the input 35a is multiplied by the number of division of the frequency divider, but in FIG. 4, by the result of the above, the modulation frequency shift of the output of the modulator 6a can be made "shallow" at 1/N of the transmitting frequency shift of the output 17, so that together with the aforementioned fact of making 1/N of the carrier input frequency of the modulator 6a, which is the output frequency of the side step oscillator 5a, the circuit construction of the modulator 6a can substantially be simplified compared with that shown in FIG. 1 and FIG. 3 and at the same time it enables an improvement of the modulation characteristics. The transmission frequency bandwidth of the loop 30a viewed from the input 35a to the output 36a may be more and more narrowed in proportion to increase of the frequency dividing number N of the frequency dividers 41 and 42, but the following limitations thereto exist. Namely, such narrowing of the bandwidth of the loop 30a must be effected in a manner such that the spectrum of the maximum frequency shift produced in the case of frequency modulation of the output frequency of the side step oscillator 5a by the modulation input signal 19 lies in a range of no bandwidth restriction.

In the block formation as shown in FIG. 1, and in FIG. 3, a transmitting buffer amplifier 7 is added between the phase synchronizing type digital frequency synthesizer 1 and the frequency mixer 8. This is to prevent the reverse transmission of the mixed wave of the frequency mixer 8 into the local oscillation signal of the receiver 3 which remarkably deteriorate the characteristics at the receiver 3. In the conventional FM radio equipment of the multichannel simultaneous transmitting and receiving type, it is inevitable to add a buffer amplifier having large reverse transmission attenuation characteristics; however, according to the construction shown in FIG. 4, the buffer amplifier 7 is removed, and its function is taken by the fixed frequency divider 41 to prevent the mixing of the reverse transmission waves from the frequency mixer 8a. This is a subsidiary effect by the lowering of the operating frequency of the frequency mixer 8a into 1/N, but this effect also contributes considerably.

In summary, the construction of FIG. 4, can easily achieve an improvement overcoming the disadvantages of the conventional system of spurious waves produced in the frequency mixer getting into the transmitting bandwidth and of sideband noises. Furthermore, by the addition of the fixed frequency dividers 41 and 42, respectively in the output of the phase synchronizing type digital frequency synthesizer 1, and in the feedback route of the transmitting phase synchronizing system 30a, the operating frequency of the side step oscillator 5a, the modulator 6a, and the bandpass filter 9a may be reduced at an optimum frequency in view of both the operation characteristics and from the manufacture, compared with the construction shown in FIG. 3. At the same time, since there is no narrowing of the phase synchronizing range of the transmitting phase synchronizing range, the narrow bandwidth of the loop can be realized easily without using the complicated step of intentionally switching the oscillating frequency of the voltage controlled oscillator of the transmitting phase synchronizing system in gang with the variable frequency divider of the phase synchronizing type digital frequency synthesizer. In addition to the above, by the elimination of the transmitting buffer amplifier, a still further miniaturization and economization of the device can be achieved and hence more good effects may be obtained.

Figure 5:
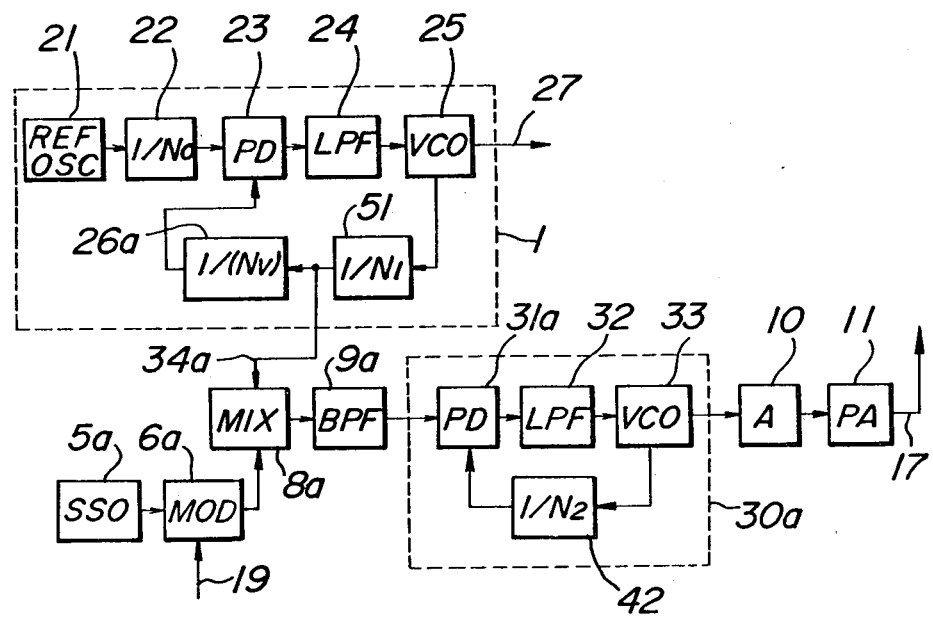
FIG. 5 is a block diagram for an improved embodiment of the transmitter shown in FIG. 4.

The device of FIG. 5

FIG. 5 shows further improvement of the construction of the FIG. 4.

For increasing the frequency $F_S$ of the output 27 of the phase synchronizing type digital frequency synthesizer 1 shown in FIG. 2, it is required to make the oscillation frequency of the voltage controlled oscillator 25 high, but in this case there is a restriction by the upper limit frequency response characteristics of the variable frequency divider 26. Therefore, when a high frequency is to be handled, it is usual for this portion to be replaced by a cascade connection of a variable frequency divider with a fixed frequency divider having a high upper limit of the frequency response characteristics, and by this the input frequency of the variable frequency divider is decreased and a stable operation is obtained. FIG. 5 shows such a construction inside the phase synchronizing type digital frequency synthesizer 1 incorporating a fixed frequency divider 51 and a variable frequency divider 26a. In this case, if the output 34a of the fixed frequency divider 51 is branched to apply an input to the frequency mixer 8a, the aforementioned function of the fixed frequency divider 41 in FIG. 4 can also be achieved by the fixed frequency divider 51, so that an efficiency increase of the power consumption compared with that in FIG. 4 can be achieved in addition to the simplification, miniaturization and economization of the circuit. The construction of the FIG. 5 will be especially effective for devices used in the higher frequency band.

Figure 6:
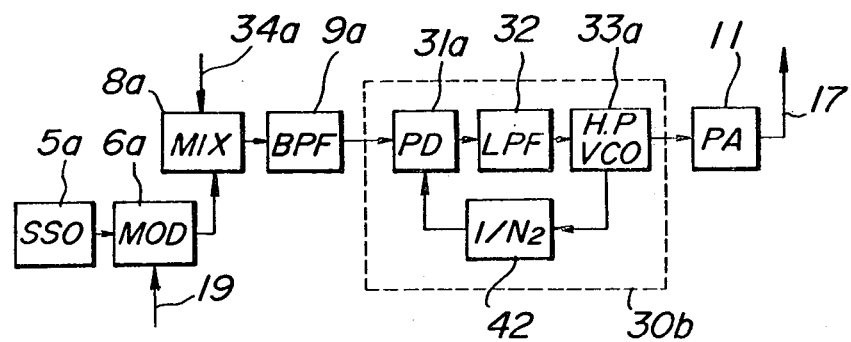
FIG. 6 is a block diagram for a further improved embodiment of the transmitter shown in FIG. 5.

The device of FIG. 6

FIG. 6 shows further improvement of the construction of the transmitter according to the present invention, in which a voltage controlled oscillator 33a of the transmitting phase synchronizing system is arranged to supply high output power able to directly drive the power amplifier 11 the oscillator 33a being a part of a loop 30b.

As has been described already, the gain of the preamplifier 10 and that of the power amplifier 11 can be decreased by an increase of the oscillating output level of the voltage controlled oscillator 33, and as a result the sideband noises in the output 17 can be decreased, but FIG. 6 further improves the above embodiment in which the preamplifier 10 is omitted and the function of the same is accomplished by the voltage controlled oscillator 33a. In general in the voltage controlled oscillator, low power consumption and high power output may be realized relatively easily by the selection of the optimum operating point and by the suitable selection of the active elements for the oscillation and amplification, and the improvement illustrated in FIG. 6 uses this feature. When this embodiment is compared with the former cases using the preamplifier 10, the numbers of circuit parts is smaller, and higher efficiency of the power consumption can be achieved. When the voltage controlled oscillator 33a is made to provide high power output, the sideband noise characteristics thereof have a tendency to deteriorate slightly in the proximity of the oscillation output frequency, as compared with the normal voltage controlled oscillator not having high power output. However, quite fortunately, there is a quite effective countermeasure therefor and by positively utilizing the feature that the phase noises of the voltage controlled oscillator at the synchronization of the phase synchronizing system are decompressed and suppressed in proportion to the magnitude of the loop gain, the sideband noises near the output frequency can greatly be suppressed.

Figure 7:
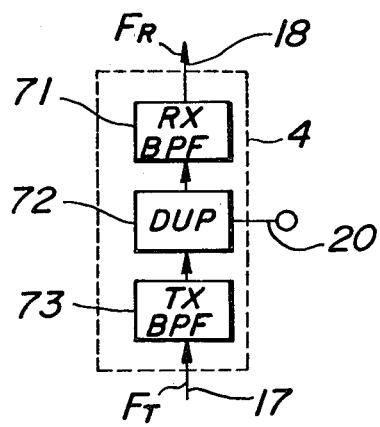
FIG. 7 is a block diagram showing the inside of an antenna duplexer.

For helping further explanation, the antenna duplexer 4 is shown in a more detailed construction in FIG. 7.

FIG. 7 shows a receiving bandpass filter 71, 73 is an antenna duplexer portion 72, and 73 is a transmitting bandpass filter 73. Among the above, the transmitting bandpass filter 73 is known per se and is known to decrease transmission of spurious waves and sideband noises outside the transmitting band from the antenna terminal 20.

In an FM radio equipment of the simultaneous transmission and receiving system, it is usual to have respective bands of the transmission frequency $F_T$ and the receiving frequency $F_R$, and in such a case the sideband noises of the transmitting output signal may tend to get into the receiving frequency band and thus to deteriorate the characteristics of the receiver.

In the transmitting bandpass filter 73, such noises that get into the receiving frequency bandwidth should be sufficiently suppressed, whereas in order to keep the loss thereof as small as possible against a large transmitting output, it is required to make the loss in the transmission band very small; furthermore since good receiving characteristics are desirable in a situation where the transmitting and receiving bands are mutually arranged very close to each other, great attenuation of the receiving band is desirable. Under such circumstances, the transmitting bandpass filter 73 should be particularly highly accurate and with large capability.

For this reason, a multistage cascade connection of low loss resonators of high cost is generally used. On the other hand as explained in FIG. 6, when a high power voltage controlled oscillator 33a is used, the sideband noise level at the outside of the transmission band is already very low per se, so that the sideband noises may sufficiently be suppressed without the use of an expensive transmitting bandpass filter 73.

Thus, it may be possible, for instance, to decrease the number of steps in the cascade combination of resonators and as the result, the fine adjustment required in the conventional filters is no longer necessary, so that a compact, light weight, economical and a low forward loss transmitter can be obtained.

The circuit construction shown in FIG. 6 can only be realized by the introduction of the transmitting phase synchronizing system according to the present invention, and the aforementioned various effects could never be obtained by the conventional construction as shown in FIG. 1 or by constructions or designs.

Figure 8:
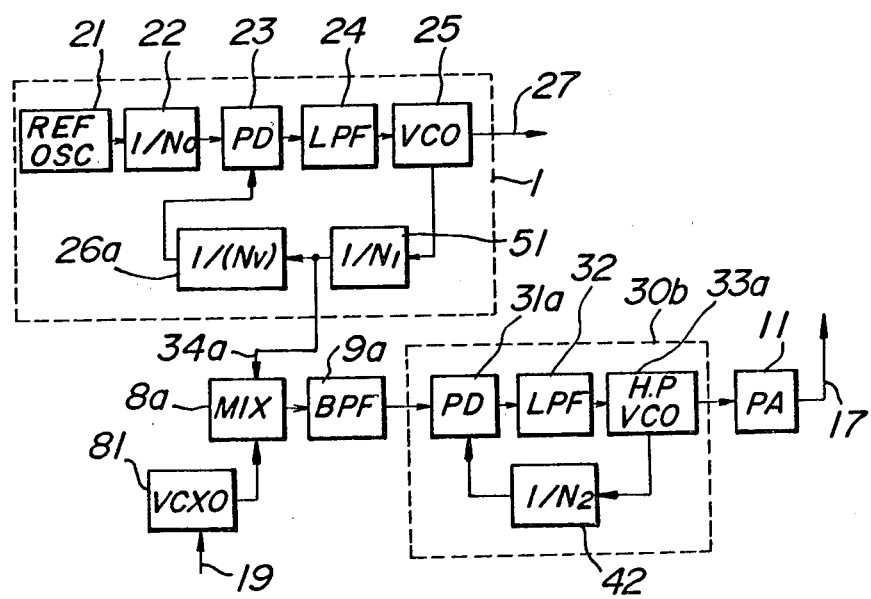
FIG. 8 is a block diagram showing an improvement in the transmitter of FIG. 6 relating particularly to the modulator.

The device of FIG. 8

FIG. 8 shows an improvement of the modulator in the transmitter according to the present invention so as to obtain still further effects. As was explained when referring to FIGS. 4 and 5, the oscillating output of the side step oscillator 5 (or 5a) is used as the carrier wave input signal, and this signal is modulated by the modulating input signal 19 in the modulator 6 (or 6a), and a modulated wave output signal is derived at its output. Usually a crystal oscillator is used for the side step oscillator 5 (or 5a), and for the circuit of the modulator 6 (or 6a) mainly a phase modulation circuit of a vector composite or variable reactance system is used. When using these kinds of devices to widen the frequency range of the modulating input signal 19 down to the lower frequency range (as is desirable in the system of the present invention, for instance, in the range of 20 Hz to 3 Hz, good modulation characteristics having less distortion factor circuit including a great many numbers of parts may be required along with very fine adjustment. In view of this fact, in the embodiment of FIG. 8, a voltage controlled crystal oscillator 81 is used in place of the side step oscillator 5 (or 5a) and the modulator 6 (or 6a), and the modulating input signal 19 is applied thereto as its controlling input signal. This has the effect of obtaining a good modulated FM wave at its output by a relatively simple construction.

In fact this construction shown in FIG. 8 can only be realized by the introduction or insertion of the transmitting phase synchronizing system 30a of the present invention. The reason thereof will be explained as follows. In general, when a voltage controlled crystal oscillator is used as an FM modulator, it is required to keep high the modulation sensitivity (frequency shift of the output signal against the modulating input signal level) in order to obtain a good quality modulated FM wave (having flat frequency shift and low distortion factor over a wide modulating input frequency). For realizing this, it has heretofore been necessary to insert an inductance in series with the crystal oscillator (or the crystal resonator) and to use the reactance of the crystal oscillator (or crystal resonator) in a capacitive range or near to it, or else to use a high sensitivity voltage variable element (or current variable element) such as a voltage variable capacitive element. However, when these methods have been used, the stability of the oscillation frequency has deteriorated because of an increase of the modulation sensitivity due to variation of environmental conditions such as temperature variation, source voltage variation or the like, and by the variation due to aging of the parts forming the voltage controlled crystal oscillator. Among the above factors, the temperature variation has the most influence, and the conventional methods for obtaining a high modulation sensitivity and a high stabilization of the oscillation frequency are mainly to add a control circuit for the temperature compensation in the frequency controlling circuit of the modulation input or to arrange to put the voltage controlled crystal oscillator itself in a thermostatic bath or the like. However, in these methods, the number of parts or the labor required to make the adjustments may increase so that these are not suitable in view of intended miniaturization and economization of the device.

In FIG. 8, the above-mentioned transmitting phase synchronization system 30a is inserted, and by its multiplying function, the frequency shift of the modulated FM wave of the voltage controlled crystal oscillator 81 may be decreased to 1/N of the frequency shift of the transmitting output $F_T$. The simplification of the circuit of the voltage controlled crystal oscillator 81 and the achievement of the high stability of oscillating output frequency result therefrom.

Figure 9:
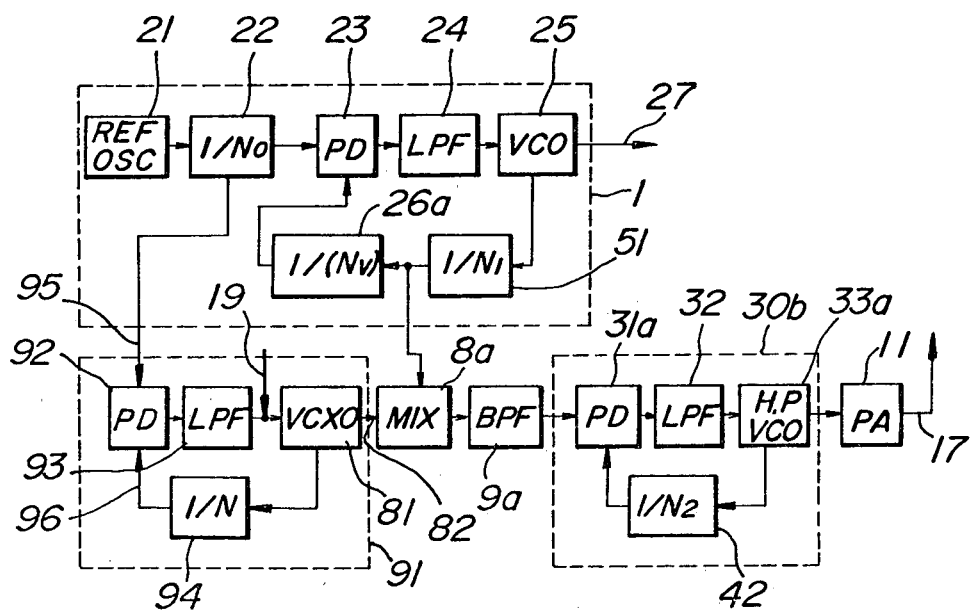
FIG. 9 is a block diagram showing further improvement of the transmitter of FIG. 8.

The device of FIG. 9

The frequency shift of the transmitting output 17 is determined by the frequency stability of both the reference oscillator 21 of the phase synchronizing type digital frequency synthesizer 1 and of the side step oscillator 5 in FIGS. 1 and 3 or of the side step oscillator 5a in FIGS. 4, 5 and 6, which is replaced by the voltage controlled crystal oscillator 81 in FIG. 8, and when the equipment is placed under a strict requirement for the transmitting output frequency shift, a more stringent requirement of frequency stability is proposed for these oscillators. This more stringent requirement contains the inherent possibility of making the devices very expensive. This is a general problem and already existed in the usual transmitters, not only that of the present invention.

In order to solve this problem in a device using a side step oscillator and a modulator, it is possible to obtain a high stability of the transmitting output frequency by a known transmitting method, in which a modulation phase output system is added to replace the above devices. (Japanese Patent Application Opened Number 53-41,916 "Transmitting device is frequency modulating system".)

FIG. 9, an improvement of the block diagram shown in FIG. 8, shows one method of solving the above-described problem in the case of using the voltage controlled crystal oscillator. This scheme can be carried out either by branching out the output signal of the reference oscillator 21 or by deriving an interstep output signal from the fixed frequency divider 22, which the number of the frequency division is an integer (in general it may be a rational number) and by branching it (FIG. 9 shows the latter) and introducing a new modulating phase synchronizing loop 91 having said derived signal as the reference frequency.

Operation of this loop 91 is as follows. A phase detector 92 compares the reference frequency 95, derived in the manner just described with a signal 96 which is a part of the output signal of the voltage controlled crystal oscillator 81 after dividing its frequency by a fixed frequency divider 94, and an output thereof is passed through a lowpass filter 93 and then fed to an input of the voltage controlled oscillator 81 and the resulting output is used in the feedback control. Accordingly, the output frequency 82 is controlled by the reference frequency 95.

By this method, the frequency deviation of the transmitting output 17 is deterministically decided by the quality of the output frequency, so that high stabilization of the frequency and hence low cost of the device is possible. By using a known modulation method (Japanese Opened Patent Application Number 52-93,261 "Frequency modulation system"), in which the modulating input signal 19 is superposed on a control signal between the lowpass filter 93 and the voltage controlled crystal oscillator 81, a further effect can be obtained that the modulated signal is easily derived from the voltage controlled crystal oscillator 81. The modulation characteristics thereof become FM modulation characteristics over the cutoff frequency due to the frequency response characteristics of the closed loop system, and become phase modulation characteristics below said cutoff frequency. If an FM modulation wave is derived at the output of the voltage controlled crystal oscillator 81, this cutoff frequency of the closed loop system may be set at a value lower than the lower limit frequency of the modulation input signal 19.

By this arrangement as shown in FIG. 9 in which the modulating phase synchronizing system is used in the transmitter, high stabilization of the frequency of the transmitting output can easily be realized, as compared with the conventional arrangement using a side step oscillator shown in FIG. 1, the arrangements of the present invention shown in FIGS. 3, 4, 5 and 6 or that shown in FIG. 7, in which the voltage controlled crystal oscillator is simply used as an FM modulator. Further since the frequency deviation thereof is deterministically decided only by the reference oscillation of the phase synchronizing type digital frequency synthesizer so that the frequency adjustment is made at the time of manufacture of the devices, the maintenance and administration of the user become easy and this means overall decrease of the cost of the device is achieved.

Figure 10:
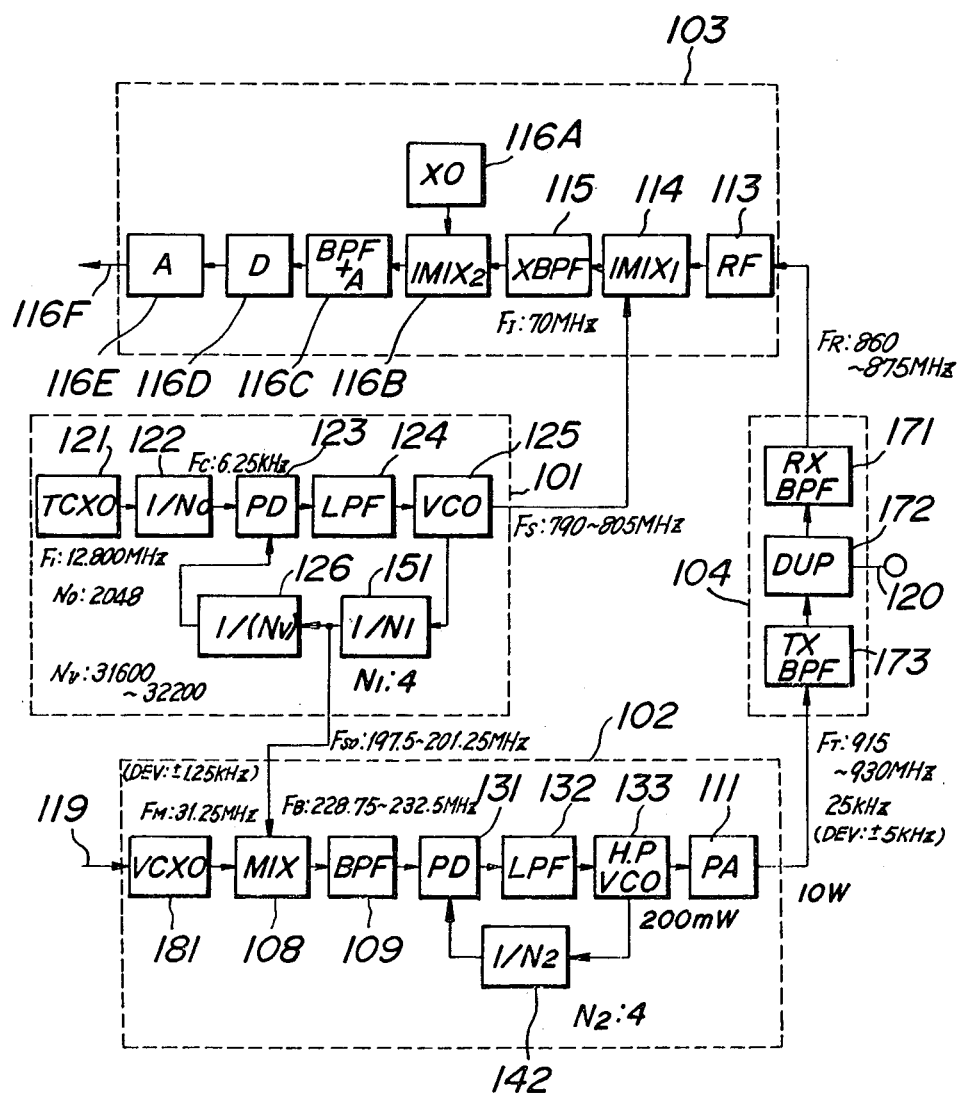
FIG. 10 is a practical embodiment of FM radio equipment for a multichannel simultaneous transmission and receiving system of the type using the transmitting system of the present invention.

The device of FIG. 10

FIG. 10 is a practical embodiment of the block diagram of the present invention as shown in FIG. 8. FIG. 10 shows mainly the block diagram of the transmitter of a 800 MHz band multichannel FM radio device of simultaneous transmitting and receiving system, together with practical values for the frequency dividing numbers and the frequencies of various portions. FIG. 10 shows a phase synchronizing type of digital frequency synthesizer 100, a transmitter 102, a receiver 103, an antenna duplexer 104, a crystal oscillator 121 of temperature compensation type, phase detectors 123 and 131, three fixed-frequency dividers 122, 142, and 151, a variable frequency divider 126, lowpass filters 124 and 132, a voltage controlled oscillator 125, a high output voltage controlled oscillator 133, a voltage controlled crystal oscillator 181, a frequency mixer 108, bandpass filters 109, 171, and 173, a power amplifier 111, a duplexer 172, a receiver high-frequency portion 113, intermediate frequency converters 114 and 116B, a crystal bandpass filter 115, a crystal oscillator 116A, a bandpass filter and amplifier 116C, an FM demodulator, 116D, a remodulated output 116E, a final ouput 116F, a modulating input 119, and an antenna terminal 120. This shows a 600 channel FM radio equipment of simultaneous transmitting and receiving system with a 25 KHz channel interval.

The voltage controlled crystal oscillator 181 may have the oscillation frequency of 31.25 MHz and it functions also as an FM modulator, the maximum frequency shift or deviation of the modulated wave appearing at the output being ±1.25 KHz, which is ¼ of the requested output frequency deviation of ±5 KHz of $F_T$. The passband width B of the bandpass filter 109 is 3.75 MHz, which is ¼ of the requested bandwidth 15 MHz of the $F_T$. A phase detector 131, a lowpass filter 132, the high output power voltage controlled oscillator 133, and the fixed frequency divider 142 forming the transmitting phase of the synchronizing system have a cutoff frequency of about 4 MHz for the closed loop circuit, and the spurious waves and the sideband noises still remaining in the signal even after selected filtering by the bandpass filter 109 are further selectively suppressed in this synchronizing system and at the same time the noises near the high output power voltage controlled oscillator 133 are suppressed. The high output power controlled oscillator 133 has a high power output over 200 mW, and the power amplifier 111 is directly driven by its output and a power of 10 W can be obtained. The transmitting bandpass filter 173 in the antenna duplexer 104 had been formed in the above-mentioned conventional device by three step or four step resonators. However, in the present embodiment, it may be formed by a two-step device and by this the sideband noises falling in the receiver 103 can sufficiently be suppressed and decreased. The frequency deviation of the transmitting output $F_T$ can be maintained within a range of $\pm 2.5$ PPM by keeping the frequency stability of the temperature compensating crystal oscillator 121 being within $\pm 2.0$ PPM and the frequency stability of the voltage controlled frequency oscillator 181 being within $\pm 5.0$ PPM.

Figure 11:
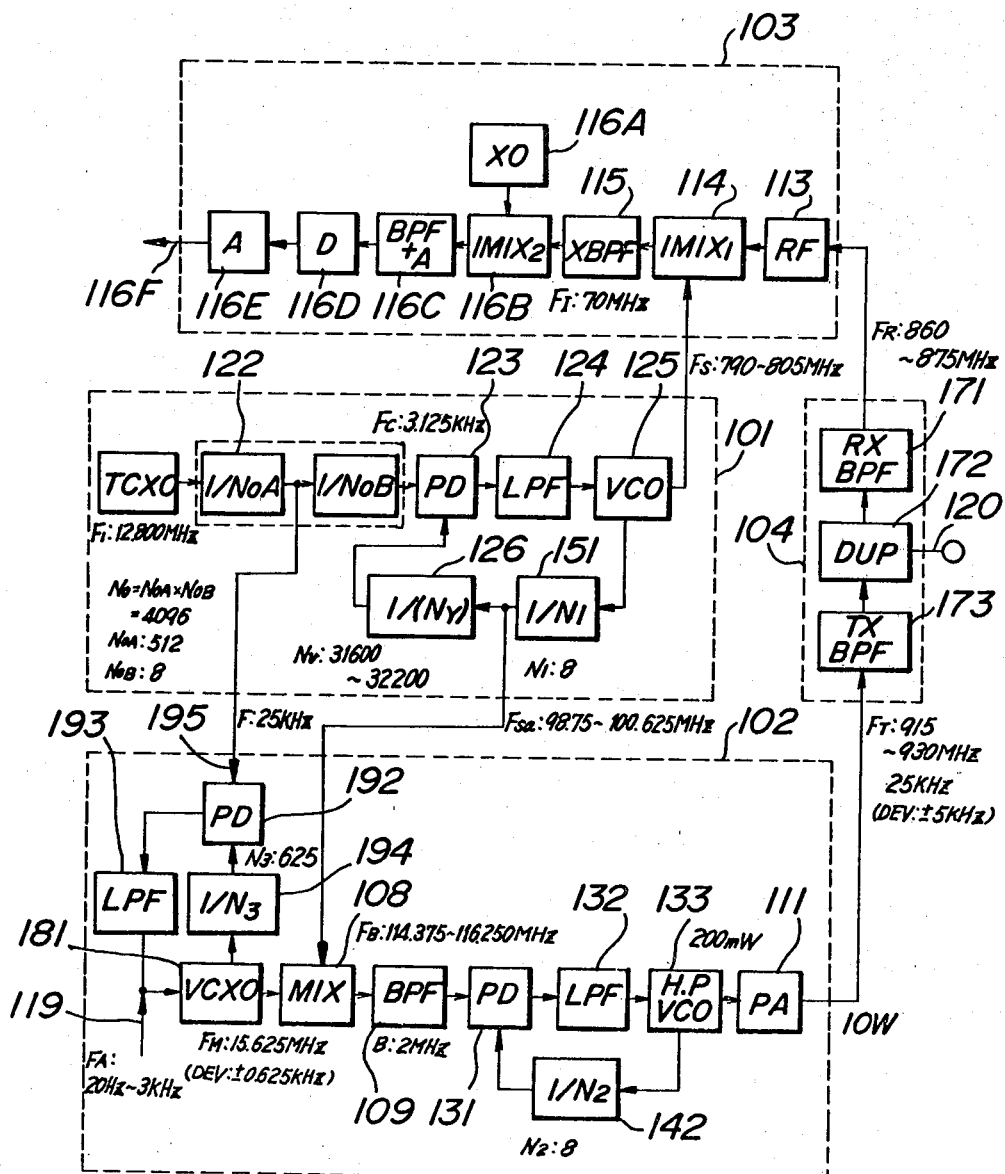
FIG. 11 is a more practical embodiment of the block diagram shown in FIG. 9.

The device of FIG. 11

FIG. 11 shows a practical embodiment of the block arrangement of the present invention shown in FIG. 9.

This circuit shows mainly the block arrangement of transmitter of a 800 MHz band multichannel simultaneous transmitting and receiving system FM radio device much like that shown in FIG. 10 together with the frequency dividing number and the frequency relationship with actual numbers. This figure shows, in addition to what is also shown in FIG. 10, a phase detector 192, a lowpass filter 193, and a fixed frequency divider 194, and these elements form the modulating phase synchronizing system together with the voltage controlled crystal oscillator 181. This modulating phase synchronizing system is applied with an input of the reference frequency of 25 KHz derived from an output 195 of the phase synchronizing type digital frequency synthesizer 101 and phase controls the oscillation frequency of 15.625 MHz of the voltage controlled crystal oscillator 181 and produces a modulated FM wave by arranging the loop cutoff frequency to be less than 20 Hz. By arranging the frequency dividing number of the fixed frequency dividers 151 and 142 as 1 and 8, respectively, the maximum frequency deviation of the voltage controlled crystal oscillator 181 is made as $\pm 0.625$ KHz, the passband width B of the bandpass filter 109 as 2 MHz, the close loop cutoff frequency of the phase detector 131, the lowpass filter 132, the high output power voltage controlled oscillator 133 and the fixed frequency divider 142 forming the transmitting phase synchronizing system as 2 MHz. The frequency deviation of the transmitting output $F_T$ is kept as $\pm 2.0$ PPM just as same as the frequency stability of the temperature compensating type crystal oscillator 121.

Industrial Applicability

As has been explained in the foregoing, in the conventional multichannel simultaneous transmitting and receiving system FM radio equipment, there have been spurious waves produced in the frequency mixer of the transmitter interfering with the transmitting bandwidth and some filtering out practices for preventing this were required. The circuit arrangements were particularly complicated for suppressing and removing the sideband noises or the like, which required increase of the number of parts and in the adjusting labor and hence cost increase inevitably accompanied such arrangements. These factors were big hindrances for the miniaturization of the devices and for saving the power consumption, whereas the system of the present invention solves all these disadvantages at once as has been explained in the foregoing.

In the foregoing explanation, the description was mainly related to a multichannel simultaneous transmitting and receiving system FM radio device, but the application of the present system is not limited to such a system and it is apparent that it may sufficiently be utilized in a normal FM transmitter.

The present invention greatly contributes an improvement of functions of the radio equipment and hence it is a useful invention in the industry.

What is claimed is:

1. A transmitter comprising a frequency mixer to one input of which is applied an output of a phase synchronizing type digital frequency synthesizer and to another input of which is applied an output of a phase or frequency modulator coupled to a side step oscillator, the output from said frequency mixer going to a bandpass filter, and from there to amplifying means via a phase synchronizing system having a phase detector connected to said bandpass filter and series connected to a lowpass filter and a voltage controlled oscillator as a main route, in which said voltage controlled oscillator is connected to said amplifying means, and a feedback route from said voltage controlled oscillator to said phase detector, said transmitter having in combination therewith a first fixed frequency divider between said phase synchronizing type digital frequency synthesizer for connecting said synthesizer to said frequency mixer, and a second fixed frequency divider connected in said feedback route of said phase synchronizing system.

2. A transmitter as claimed in claim 2, in which said phase synchronizing type digital frequency synthesizer comprises basically on a main route a series connected reference oscillator, a third fixed frequency divider, a second phase detector, a second lowpass filter, a second voltage controlled oscillator, and on a feedback route from said second voltage controlled oscillator to said second phase detector, said first fixed frequency divider and a variable frequency divider, said first frequency divider having an outlet signal that is branched, said variable frequency divider having fed to its input one branch of the output of said first fixed-frequency divider while the other branch is fed to said frequency mixer.

3. A transmitter comprising
a frequency mixer having a plurality of inputs and an output,
a phase synchronizing type digital frequency synthesizer having an output applied through a first frequency divider to one input of said frequency mixer, and
phase or frequency modulating means having an output applied to another input of said mixer and having an input to which a modulating signal is applied,
a bandpass filter having an input connected to the output from said mixer and having an output,
a phase detector having a plurality of inputs with one input connected to the output of said bandpass filter and having an output,
a lowpass filter having an input connected to the output of said phase detector,
a voltage controlled oscillator having an input connected to the output of said lowpass filter and having two outputs, amplifier means connected to one output from said voltage controlled oscillator, a feedback route from the other output of said voltage controlled oscillator to the other input to said phase detector, and a second fixed frequency divider connected in said feedback route.

4. A transmitter as claimed in claim 3 in which said phase synchronizing type digital frequency synthesizer comprises basically on a main route a series connected reference oscillator, a third fixed frequency divider, a second phase detector, a second lowpass filter, a second voltage controlled oscillator, and on a feedback route from said second voltage controlled oscillator to said second phase detector said first fixed frequency divider and a variable frequency divider, said first frequency divider having an outlet signal that is branched, said variable frequency divider having fed to its input one branch of the output of said first fixed-frequency divider while the other branch is fed to said frequency mixer.

5. A transmitter as claimed in claim 4 in which a second output of said third frequency divider is applied to said modulating means, said modulating means comprising a modulating phase synchronizing system having on a main route a third phase detector to which the second output of said third frequency divider is applied, a series connected lowpass filter, a third voltage controlled crystal oscillator and, on a feedback route a fourth fixed frequency divider between said third voltage controlled crystal oscillator and said third phase detector, said modulating signal being applied at a coupling portion between said third lowpass filter on the main route and said third voltage controlled crystal oscillator, whereby said modulating phase synchronizing system provides a phase synchronizing system having a phase or frequency modulation function.

6. A transmitter as claimed in claim 3 wherein said voltage controlled oscillator is a high output power oscillator and said amplifying means comprises simply a power amplifier.

7. A transmitter as claimed in claim 3 wherein said amplifying means comprises a pre-amplifier in series with a power amplifier.

8. A transmitter as claimed in claim 3 in which a side step oscillator is coupled to said modulating means.

9. A transmitter as claimed in claim 3 in which said modulating means comprises a voltage controlled crystal oscillator.

* * * * *

UNITED STATES PATENT AND TRADEMARK OFFICE
CERTIFICATE OF CORRECTION

PATENT NO. : 4,395,776
DATED : July 26, 1983
INVENTOR(S) : Yukio Naito, Masahide Tamura, Shigeo Takahashi It is certified that error appears in the above–identified patent and that said Letters Patent are hereby corrected as shown below:

Column 1, line 11, delete "ART", in the heading.
          line 42, "noises" should read --noise--.
Column 3, line 8, "receiver 13" should read --receiver 3--.
          line 27, after "realizing" insert --a--.
Column 7, line 47, "at" should read --of--.
Column 9, lines 23-24, delete "73 is".
          line 68, after "by" insert --similar--.
Column 10, line 19, "3 Hz" should read --3 KHz--.
Column 11, line 30, "is" should read --in--.
          line 38, before "which" insert --of--.
Column 14, line 28, "between" should read --in--.
          line 33, "claim 2" should read --claim 1--.
Column 16, line 2, after "connected" insert --third--.

Signed and Sealed this

Twenty-seventh Day of September 1983

[SEAL]

Attest:

GERALD J. MOSSINGHOFF

Attesting Officer      Commissioner of Patents and Trademarks